(12) United States Patent
Cirit et al.

(10) Patent No.: US 9,020,087 B2
(45) Date of Patent: Apr. 28, 2015

(54) ALL DIGITAL BURST-MODE CLOCK AND DATA RECOVERY (CDR)

(71) Applicant: Exar Corporation, Fremont, CA (US)

(72) Inventors: Sadettin Cirit, Sunnyvale, CA (US); Jose Antonio Salcedo, Livermore, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 13/894,719

(22) Filed: May 15, 2013

(65) Prior Publication Data

US 2014/0126678 A1    May 8, 2014

Related U.S. Application Data

(60) Provisional application No. 61/647,147, filed on May 15, 2012.

(51) Int. Cl.
| | |
|---|---|
| *H04L 7/00* | (2006.01) |
| *H04L 7/033* | (2006.01) |
| *H03L 7/08* | (2006.01) |
| *H03L 7/081* | (2006.01) |

(52) U.S. Cl.
CPC ............. *H04L 7/0337* (2013.01); *H04L 7/033* (2013.01); *H03L 7/0807* (2013.01); *H03L 7/0814* (2013.01)

(58) Field of Classification Search
CPC ..... H04L 7/033; H04L 7/0337; H04L 7/0037; H04L 7/0025; H04L 25/0272; H04L 25/0282; H04L 25/0298; H04L 25/03057; H04L 25/08; H04L 25/14; H04L 25/4902; H04L 25/4917; H04L 27/2096; H04L 27/223
USPC ......... 375/219, 271, 294, 316, 324, 327, 339, 375/354, 355, 357, 359–361, 362, 371
See application file for complete search history.

(56) References Cited

U.S. PATENT DOCUMENTS

| | | | | |
|---|---|---|---|---|
| 6,735,270 | B1 * | 5/2004 | Yeung | 377/34 |
| 7,433,397 | B2 * | 10/2008 | Garlepp et al. | 375/229 |
| 8,090,067 | B2 * | 1/2012 | Ho | 375/374 |
| 8,650,429 | B1 * | 2/2014 | Starr et al. | 713/400 |
| 8,666,013 | B1 * | 3/2014 | Khor et al. | 375/376 |
| 2002/0056854 | A1 * | 5/2002 | Tang et al. | 257/200 |
| 2009/0290672 | A1 * | 11/2009 | Ho | 375/374 |
| 2012/0008723 | A1 * | 1/2012 | Stojanovic | 375/355 |

* cited by examiner

*Primary Examiner* — Hirdepal Singh
(74) *Attorney, Agent, or Firm* — Kilpatrick Townsend & Stockton LLP

(57) ABSTRACT

The present invention relates to a clock and data recovery (CDR) unit comprising of a bang-bang phase detector to receive data and a recovered clock from a phase selector multiplexer. The phase detector produces a late and an early comparison output. A block (digital filter) receives the late and early input and produces a multiplexer selector control signal. The phase selector multiplexer selects a clock phase as the recovered clock signal using multiplexer selector control signal.

19 Claims, 1 Drawing Sheet

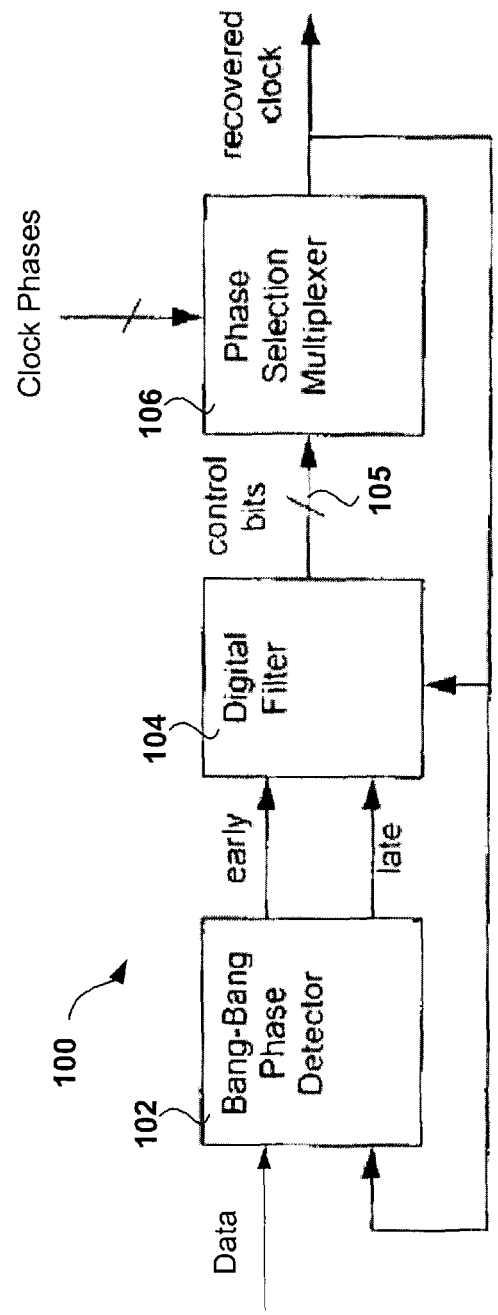

ALL DIGITAL BURST-MODE CLOCK AND DATA RECOVERY (CDR)

CLAIM OF PRIORITY

This application claims priority from the following application, which is hereby incorporated in its entirety: U.S. Provisional Application No. 61/647,147 entitled: "ALL DIGITAL BURST-MODE CLOCK AND DATA RECOVERY (CDR)", by Sadettin Cirit, et al., filed May 15, 2012.

FIELD OF THE INVENTION

The present invention relates to clock and data recovery (CDR) unit, especially to CDR units used to recover a clock from a universal serial bus (USB) data signal.

BACKGROUND

The USB 2.0 standard effectively requires a clock recovery within 12 clock periods. The shortness of this time period is a challenge for CDR designers.

Typically, analog CDRs require more than 12 clock periods to recover a clock. An open loop CDR using two Voltage Control Oscillators (VCOs) can recover a clock within 12 clock periods; however, the power consumed by the VCOs can be significant.

SUMMARY

Embodiments of the present CDR design recover the data and clock from a random USB 2.0 standard data stream in less than 12-bit time periods. The CDR achieves this task by making real-time phase adjustments to the recovered clock in a closed loop system. The appropriate phase is selected from available phases in a glitch-free mode and hang-up is avoided due to data and clock transition alignment. A special digital filter and a multiplexer tree are used. This design eliminates the need of the multiple voltage controlled oscillators that are commonly used in open loop architectures. The following CDR will consume less power, is more easily adaptable to multi-channel designs, will have better frequency offset tracking and will have better jitter suppression.

BRIEF DESCRIPTION OF THE DRAWINGS

FIG. 1 is a diagram of a clock and data recovery (CDR) unit of one embodiment of the present invention.

DETAILED DESCRIPTION

A clock and data recovery (CDR) unit 100 includes a phase detector 102. The phase detector can be a bang-bang phase detector, such as an Alexander-type bang-bang detector. The phase detector 102 receives data, such as an USB signal and a recovered clock from a phase selector multiplexer 106. The phase detector 102 then produces a late and an early comparison output. The late output indicating that the current recovered clock is behind the data signal in phase. The early output indicates that the current recovered clock is ahead of the data signal in phase.

The block 104 receives the late and early comparison outputs and produces a multiplexer selector control signal on line 105. The phase selector multiplexer 106 selects a clock phase as the recovered clock signal using the multiplexer selector control signal from block 104.

The block 104 can increment the multiplexer selector control signal when the early output is high and the late output is low; decrement the multiplexer selector control signal when the early output is low and the late output is high; and implement a fixed phase recovery operation when the early and late outputs are both high.

The block 104 operates as a fast digital filter that does not rely on past phase detector outputs except for the phase recovery operation. This speeds up the operation of the CDR unit from systems which use more complex digital filters.

The incremented and decremented values refer to values that are used to change the phase of the recovered clock. The incremented multiplexer selector control signal is one that selects a new recovered clock which moves the phase forward. The decremented multiplexer selector control signal is one that selects a new recovered clock that moves the phase backward.

The fixed phase recovery operation can include a function to increment the multiplexer selector control signal for a fixed number of periods greater than one, and then return to normal operation. In one embodiment, the fixed phase recovery operation increments for four or more clock periods while ignoring the output of the phase detector for these periods.

This fixed phase recovery operation prevents the phase of the recovered clock from being mistakenly kept 180° out of phase. As the recovered clock moves out of 180° out of phase, the phase detector 102 outputs can mistakenly indicate that the phase needs to be decremented back into being 180° out of phase. By ignoring the output of the phase detector 102 for a few clock periods, the system is thus prevented from being mistakenly pushed back into being 180° out of phase.

The CDR unit 100 does not use a voltage controlled oscillator (VCO) and can lock the recovered clock to the data within 3 clock cycles.

The signals through the clock and data recovery unit are such that the switching of the multiplexer does not produce glitches. That is, the speeds of the signals are such that a new selected phase does not go high/low soon after the old phase goes low/high which would result in a glitch.

In one embodiment, the number of selectable clock phases is four or more. Four phases may be the minimum for useful function. The upper limit on the number of clock phases is determined by the fact that additional clock phases make the filter and multiplexer more complexes and therefore have higher delay, and this can limit the data rate that the CDR can recover. In one embodiment, ten selectable clock phases are used.

The multiplexer selector control signal can be a Grey code. In one example, a 10-state 4-bit Grey code is used to encode a selection of the one of 10 clock phases provided to the phase selection multiplexer 106. The incrementing and decrementing of the Grey code refer to cycling through the Grey codes such that the recovered clock phase is moved forward or moved backward.

The phase detector 102 can have additional outputs. In one embodiment, four outputs can be produced: a little early, very early, a little late and very late. The block 104 can act on these additional signals. For the four output embodiment, the very early and very late outputs can cause a fixed recovery operation over multiple clock periods and the little early and little late outputs can cause a normal increment/decrement.

The following describes an exemplary implementation of the CDR unit 100. In one embodiment, the CDR 100 is based on closed loop negative feedback architecture. It consists of bang-bang type phase detector 102, digital filter 104 and a phase selection multiplexer 106. The bang-bang phase detector 102 compares the input data and the recovered clock.

Based on the clock edge location with respect to the center of the data phase detector creates "EARLY" and "LATE" outputs. These outputs are fed to the digital filter 104. The digital filter 104 is designed as a bi-directional 4-bit Grey code counter with special features. Digital filter output is sent to the phase selection multiplexer. In addition to the filter output, the phase selection multiplexer receives ten clock signals. Based on the digital filter output, the multiplexer circuit selects the appropriate clock. These ten clock signals have the same frequency and are separated in phase by 36 degrees from each other. The bang-bang operation is explained below:

| EARLY | LATE | RECOVERED CLOCK VS. INPUT DATA |
|---|---|---|
| 0 | 0 | THERE IS NO DATA TRANSITION |
| 0 | 1 | CLOCK EDGE COMES AFTER CENTER OF DATA |
| 1 | 0 | CLOCK EDGE COMES BEFORE CENTER OF DATA |
| 1 | 1 | CLOCK EDGE COINCIDES WITH DATA TRANSITION |

Digital filter receives the EARLY and LATE signals form the phase detector and performs the operation described below. Counting up or down is done in Grey code:

| EARLY | LATE | FILTER OUTPUT |
|---|---|---|
| 0 | 0 | DON'T CHANGE |
| 0 | 1 | COUNT DOWN BY 1 |
| 1 | 0 | COUNT UP BY 1 |
| 1 | 1 | COUNT UP BY 4 SEQUENTIALLY |

When there is no data transition, the filter keeps the previous state. This ensures that the clock edge location, with respect to data, does not change during the absence of data transitions. A LATE signal causes the filter to count down by 1. This, in return, shifts the recovered clock edge to left. Conversely, an EARLY signal makes the filter count up by 1 to bring the recovered clock edge to right. Ultimately, the feedback aligns the recovered clock edge at the center of the data. When the data and the clock are 180 degrees out of phase, (i.e. the data transition and the clock edge align), the phase detector can produce both EARLY and LATE signals. In this case, the CDR can potentially get stuck at this undesirable state for some time. We prevent this case by forcing the digital filter to count up for four consecutive periods. While counting up for four periods, the digital filter ignores the phase detector output. This provision guarantees that the clock edge is removed from the data transition and brought close to the desired center of the data eye.

The multiplexer circuit selects one out of ten clock signals based on the digital filter output. The main task of this block is to produce the final recovered clock without glitches. This task is accomplished by firstly, having the digital filter output change one bit at a time, as done in a Grey code, and secondly, by putting lower and upper boundaries to the loop delay.

Since our design reuses the available transmitter clock, it does not need an oscillator. The prior, open loop gated voltage controlled oscillator (VCO) architecture uses two oscillators controlled by a master phase locked loop. By directly using the phase locked loop output and not having to duplicate the oscillator twice, our design becomes much more power efficient. It also yields a functional cell which is easily used in multi-channel products since it only needs one oscillator for as many channels as desired. The prior open loop architecture can tolerate very little frequency offset between incoming data and the on-board reference clock that is used in high frequency clock synthesis. Moreover, it does not have any jitter filtering capability. Our design can tolerate considerably much higher frequency offset between data and reference clock. It also filters high frequency jitter from the recovered data and clock; making them cleaner. This enables the digital section of the chip to have a higher timing budget.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

The invention claimed is:

1. A clock and data recovery (CDR) unit comprising:
    a bang-bang phase detector configured to receive data and to receive a recovered clock from a phase selector multiplexer and to produce a phase comparison output, the phase comparison output indicating that the recovered clock is early or late, as compared with the received data;
    a block to receive the phase comparison output, and to produce a Grey code output, wherein when the block implements a fixed phase recovery operation in response to the phase comparison output indicating that the recovered clock is both early and late, and wherein the fixed phase recovery operation includes advancing the Grey code output for a fixed number of periods greater than one, then returning to normal operation;
    the phase selector multiplexer to select a clock phase as the recovered clock signal using the Grey code output.

2. The clock and data recovery unit of claim 1, wherein the block increments the Grey code output when the early output is high and the late output is low.

3. The clock and data recovery unit of claim 2, wherein the block decrements the Grey code output when the early output is low and the late output is high.

4. The clock and data recovery data unit of claim 1, wherein the fixed number of periods is four or more.

5. The clock and data recovery unit of claim 1, wherein the unit does not use a voltage controlled oscillator (VCO).

6. The clock and data recovery unit of claim 1, wherein the CDR unit locks the recovered clock to the data within 3 clock cycles.

7. The clock and data recovery unit of claim 1, wherein the signals through the clock and data recovery unit are such that the switching of the multiplexer does not produce glitches.

8. The clock and data recovery unit of claim 1, wherein the data is USB input data.

9. A clock and data recovery (CDR) unit comprising:
    a phase detector configured to receive data and to receive a recovered clock from a phase selector and to produce a phase comparison output, the phase comparison output indicating that the recovered clock is early or late, as compared with the received data;
    a block configured to receive the phase comparison output, and to produce a multiplexer selector control signal, the multiplexer selector control signal being incremented in response to the comparison output indicating that the recovered clock is early, the multiplexer selector control signal being decremented in response to the comparison output indicating that the recovered clock is late, and the block implementing a fixed phase recovery operation in response to the comparison output indicating that the recovered clock is both early and late, wherein the fixed phase recovery operation includes incrementing the multiplexer selector control signal for a fixed number of periods greater than one, then returning to normal operation; and the phase selector multiplexer to use the multiplexer selector control signal to select a clock phase as the recovered clock signal.

10. The clock and data recovery data unit of claim 9, wherein the fixed number periods is four or more.

11. The clock and data recovery unit of claim 9, wherein the unit does not use a voltage controlled oscillator (VCO).

12. The clock and data recovery unit of claim 9, wherein the CDR unit locks the recovered clock to the data within 3 clock cycles.

13. The clock and data recovery unit of claim 9, wherein the signals through the clock and data recovery unit are such that the switching of the multiplexer does not produce glitches.

14. The clock and data recovery unit of claim 9, wherein the data is USB input data.

15. The clock and data recovery unit of claim 9, wherein the multiplexer selector control signal is a Grey code.

16. The clock and data recovery unit of claim 9, wherein the phase detector is a bang-bang phase detector.

17. The clock and data recovery unit of claim 9, further comprising a very early and a very late comparison output of the phase detector; the block further implementing a fixed multi-period operation when the very early or the very late output is high.

18. The clock and data recovery unit of claim 9, wherein the number of selectable phases is four or more.

19. The clock and data recovery unit of claim 18, wherein the number of selectable phases is ten.

\* \* \* \* \*